United States Patent [19]
Sakurai

[11] Patent Number: 6,066,944
[45] Date of Patent: May 23, 2000

[54] HIGH SPEED CURRENT MIRROR CIRCUIT AND METHOD

[75] Inventor: Satoshi Sakurai, San Jose, Calif.

[73] Assignee: National Semiconductor Corporation, Santa Clara, Calif.

[21] Appl. No.: 09/252,537

[22] Filed: Feb. 18, 1999

[51] Int. Cl.[7] .............................. G05F 3/16; G05F 1/10; H03F 3/04; H03K 3/01

[52] U.S. Cl. ...................... 323/315; 323/313; 327/543; 330/254

[58] Field of Search ..................................... 323/315, 314, 323/313, 316; 327/543; 330/257, 253, 254

[56] References Cited

U.S. PATENT DOCUMENTS

| | | | |
|---|---|---|---|
| 4,697,153 | 9/1987 | Lish | 330/277 |
| 4,893,090 | 1/1990 | Boudeewijns | 330/253 |
| 5,311,115 | 5/1994 | Archer | 323/315 |
| 5,359,296 | 10/1994 | Brooks et al. | 330/288 |
| 5,412,336 | 5/1995 | Barrett, Jr. et al. | 327/560 |
| 5,457,426 | 10/1995 | Brehmer | 330/253 |
| 5,469,104 | 11/1995 | Smith et al. | 327/491 |
| 5,491,443 | 2/1996 | Zarabadi | 327/391 |
| 5,498,953 | 3/1996 | Ryat | 323/315 |
| 5,515,010 | 5/1996 | Peterson | 330/288 |
| 5,523,718 | 6/1996 | Butler | 330/255 |
| 5,559,425 | 9/1996 | Allman | 323/315 |
| 5,589,800 | 12/1996 | Peterson | 330/288 |
| 5,640,681 | 6/1997 | Barrett, Jr. et al. | 455/38.1 |
| 5,680,038 | 10/1997 | Fiedler | 323/315 |

*Primary Examiner*—Edward H. Tso
*Assistant Examiner*—Rajnikant D. Patel
*Attorney, Agent, or Firm*—Limbach & Limbach L.L.P.

[57] ABSTRACT

A current mirror circuit suitable for use as an amplifier active load having first and second MOS transistors connected in series together with third and fourth MOS transistors connected in series. The first and third transistors have common source and common gate connections, with the drain of the second transistor forming the current mirror input and the drain of the fourth transistor forming the current mirror output. Bias circuitry operates to maintain the second transistor in the triode region of operation and to maintain the fourth transistor in the saturation region of operation. The second transistor has a small geometry compared to the fourth transistor so as to enhance the transient response performance of the current mirror circuit.

29 Claims, 2 Drawing Sheets

HIGH SPEED CURRENT MIRROR CIRCUIT AND METHOD

BACKGROUND OF THE INVENTION

1. Field of the Invention

The present invention relates generally to electronic circuits and methods and, in particular, to a high speed current mirror circuit for use, by way of example, as an active amplifier load.

2. Description of Related Art

Amplifier circuits commonly use active loads, as compared to passive or resistive loads, for the purpose of increased gain together with low voltage operation. Current mirrors are a common type of active load. Referring to the drawings, FIG. 1 is a schematic diagram of a buffer circuit which utilizes a differential amplifier 10. As will be explained, amplifier 10 includes a conventional current mirror active load.

FIG. 2 is a simplified diagram of the FIG. 1 buffer circuit showing that the amplifier 10 is configured as a voltage follower circuit with the output connected directly back to the inverting input. In a typical application, amplifier 10 is used to buffer the output of a reference voltage circuit (not depicted) so that the fixed reference voltage generated by the reference circuit can be utilized by other local circuits. Buffering is required since the local circuits may introduce noise onto the reference circuit thereby corrupting the circuit.

Amplifier 10 includes N type transistors 12A and 12B which form a differential transistor pair having their sources connected to a common tail current source 20. Source 20 produces a relatively constant output current $I_B$. A pair of cascode connected N type transistors 14A and 14B is connected to input transistors 12A and 12B and have their gates connected to a bias voltage $V_{BN}$. As is well known, transistors 14A and 14B operate to increase the effective impedance seen by the active load thereby increasing the voltage gain of the amplifier.

The active load includes P type transistor pair 18A and 18B which have their gates connected to a common bias voltage point. As will be explained, transistors 18A and 18B function together as a current mirror, with the nominal currents in the transistors being equal. The active load further includes cascode connected transistors 16A and 16B having their gates connected to a bias voltage source VBP. Transistors 16A and 16B operate to increase the output impedance of the active load thereby increasing the amplifier gain.

As is well known, when an MOS transistor is biased to operate in the saturation region, the drain-source current is proportional to the aspect ratio of the transistor, that is, the ratio of channel width to channel length (W/L). If two matched transistors operating in the saturation region are biased at the same point, the ratio of the relative current magnitudes will be the same as the ratio of the two aspect ratios. For transistors implemented in a common integrated circuit, such transistors usually have the same channel length L so that channel aspect ratio is controlled by changing the effective channel width W.

Transistors 18A and 18B are matched devices having the same geometry and the same gate-source voltage. In addition, the steady state drain-source voltages of the two transistors are the same due to the action of transistors 16A and 16B. Transistors 18A and 18B thus operate as a high precession current mirror, with the current $I_B$ produced by current source 20 being split equally between the two transistors. The biasing of transistors 18A and 18B insures that the drain-source voltage is greater than the difference between the threshold voltage of the transistors and the gate-source voltage so that the two transistors operate in the saturation region, a requirement for achieving high gain. If the drain-source voltage is smaller than the difference between the gate-source voltage and the threshold voltage, the transistor will operate in the triode (linear) region and will have a impedance significantly smaller than the impedance achieved when operating in the saturation region.

The output of amplifier 10 is at the node intermediate transistors 14B and 16B and is connected directly to the gate of transistor 12B which forms the inverting amplifier input. The node intermediate transistors 16A and 14A is connected to the gates of transistors 18A and 18B, with this connection providing feedback which biases transistors 18A and 18B at the proper level.

In order to maximize the available voltage swing of the output Out, bias voltage $V_{BP}$ is made as close as possible to the supply voltage $V_{DD}$. However, voltage $V_{BP}$ must be sufficiently small to ensure that the drain-source voltage across transistors 18A and 18B is large enough for transistors 18A and 18B to be in the saturation region. The available voltage swing is further enhanced by making transistors 16A and 16B large (wide channel) to keep the required saturation voltage as small as possible.

Since amplifier 10 has only a single stage, the transient response of the single pole system is very fast for the amount of current required. However, when transistors 16A and 16B are made large for the reason previously noted, the parasitic capacitances of the transistors cause the associated non-dominant poles to adversely affect the transient response. As a result, ringing appears in the output as the amplifier attempts to recover from the dynamic disturbances introduced by the local circuits connected to the amplifier output.

The present invention overcomes the above-noted shortcomings of the prior art. A current mirror circuit suitable of use as an active amplifier load permits low voltage operation while providing high gain, wide voltage swing and improved transient response. These and other advantages of the present invention will become apparent to those skilled in the art based upon a reading of the following Detailed Description of the Invention.

SUMMARY OF THE INVENTION

A current mirror circuit suitable for use as an active load in a high speed amplifier is disclosed. The circuit includes four transistors, typically all P type MOS transistor, with the first and second being connected in series and the third and fourth being connected in series. The fourth transistor has a channel aspect ratio which is larger than the aspect ratio of the second transistor, typically by a factor of ten. Bias circuitry is included which operates to maintain the drain voltage of the first and third transistors at the same level to ensure the accuracy of the current mirror. In addition, the bias circuitry operates to maintain the first, third and fourth transistors in the saturation region so as to ensure high gain operation when the current mirror is used as an active amplifier load. The smaller second transistor operates in the triode region, with the smaller size enhancing the transient response of the circuit.

DETAILED DESCRIPTION OF THE INVENTION

Referring again to the drawings, an amplifier 22 incorporating a current mirror circuit in accordance with the present invention is disclosed. Biasing circuitry 24 for biasing the current mirror circuit is also disclosed. Amplifier 22 is configured as a voltage buffer with the inverting input being connected directly to the output Out. Amplifier 22 includes a differential transistor pair 23A and 23B having their sources connected to a tail current source 30. Transistors 25A and 25B are connected in a cascode configuration to increase the effective impedance as seen by the active load. The gates of transistors 25A and 25B are both connected to a bias voltage $V_{BN}$. Transistors 23A, 23B, 25A and 25B are all N type devices.

Figure 2:
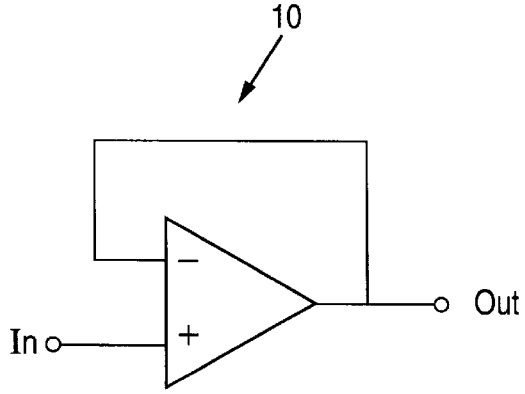
FIG. 2 is a simplified block diagram of the FIG. 1 buffer circuit.

The current mirror active load for amplifier 22 includes P type transistors 28A and 28B having their gates connected together and to the drain of transistor 25A. As previously described in connection with FIG. 2, this feedback configuration operates to bias the gates of the load transistors 28A and 28B. Transistors 26A and 26B are cascode connected transistors which operate to increase the impedance of the active load. An important aspect of the present invention is the utilization of a small geometry transistor 26A as compared to transistor 26B. Transistor 26B remains large since this transistor directly affects the range of the output voltage swing and the amplifier gain. The reduction in size of only transistor 26A does greatly reduce the associated parasitic capacitances and therefore significantly enhances the transient response of the amplifier. Preferably, transistor 26B has an aspect ratio ten times greater than the aspect ratio of transistor 26A, but even a size difference of 1.5 to 1 provides some of the advantages of the present invention.

The reduction in size of transistor 26A relative to transistor 26B introduces problems which need to be addressed in order to maintain the other performance parameters of the amplifier 22. For example, since amplifier 22 is used in the exemplary embodiment as a reference voltage buffer, it is important that the amplifier have a very small input offset voltage, particularly over temperature. Any DC error in the amplifier will result in a deviation in the magnitude of the reference voltage buffered by the amplifier. In order to achieve a low input offset voltage, load transistors 28A and 28B must divide the current $I_{C1}$ provided by current source 30 equally under steady state operating conditions. This requires that the gate-source and drain-source voltages of the two matched transistors 28A and 28B to be made the same.

The respective gates and sources of transistors 28A and 28B are tied together so that the gate and the source voltages are the same. In order for the drain-source voltages to be equal, voltage V1 at the node intermediate load transistors 28B and 26B must be equal to voltage V2 at the node intermediate load transistors 28A and 26A. This relationship needs to be maintained over temperature. As will be explained, the size difference of transistors 26A and 26B tends to make V1 and V2 unequal.

Bias circuit 24 operates to separately control the gate voltages of transistors 26A and 26B so as to maintain the desired equality between voltages V1 and V2 and to control the actual value of the two voltages. The gate-source voltage of a transistor in saturation is inversely proportional to the square root of the channel width W for a given current. Since transistor 26A is smaller than transistor 26B in terms of channel width, the gate-source voltage of transistor 26A will be greater than that of transistor 26B for the same current. (This is true even though, as will be explained, transistor 26A is not actually operating in the saturation region.) Thus, among other things, bias circuit 24 will set the gate voltage of transistor 26A to a lower voltage than the gate of transistor 26B by an amount equal to the difference in the gate-source voltage of transistors 26A and 26B.

The drain of transistor 26A is connected to the gates of transistors 28A and 28B and thus the drain voltage of transistor 26A remains relatively fixed. As will be explained later, the source voltage of transistor 26A is restricted in range. Thus, the drain-source voltage of transistor 26A has a restricted magnitude. In that transistor 26A is a small device it will have a larger gate-source voltage than the transistor would otherwise have if it were larger. The drain-source voltage of transistor 26A will be less than the difference between the gate-source voltage and the threshold voltage of transistor 26A. Thus, by definition, transistor 26A will operate in the linear or triode region as opposed to the saturation region. The fact that transistor 26A operates in the triode region and that transistor 26B operates in the saturation region complicates the biasing circuitry, but does not adversely affect the DC accuracy of the buffer circuit.

Biasing circuit 24 includes a P type transistor 40 connected in series with another P type transistor 42 which is, in turn, connected in series with a second current source 34 which produces current $I_{C3}$. A third P type transistor 38 is connected between the drain of transistor 40 and a third current source 32 which produces current $I_{C2}$. Thus, it can be seen by inspection that transistor 40 conducts a current having a magnitude equal to the sum of current sources 32 and 34 ($I_{C2}+I_{C3}$), transistor 42 conducts a current equal to $I_{C3}$ and transistor 38 conducts a current equal to $I_{C2}$.

Transistor 38 has its gate and drain tied together so that the transistor will operate in the saturation region. The gate/drain of transistor 38 is connected to the gate of transistor 26B which also operates in the saturation region. Thus, voltage V1 at the source of transistor 26B can be made equal to voltage V3 at the source of transistor 38 by forcing the gate-source voltages of the two transistors, which operate in the saturation region, to be equal. This can be accomplished by controlling the relative transistor sizes and currents in accordance with the following equation:

$$W_{38}/W_{26B}=I_{C2}/(I_{C1}/2) \tag{1}$$

where $W_{38}$ and $W_{26B}$ are the channel widths of transistors 38 and 26B, respectively, and $I_{C2}$ and $I_{C1}/2$ are the drain-source currents of transistors 38 and 26B, respectively.

Thus, for example, if transistors 38 and 26B are the same size and $I_{C2}$ is one-half of $I_{C1}$, source voltage V3 will be equal to source voltage V1. Note that these voltages will track over temperature. In a typical implementation, transistor 38 would actually be about one tenth the size of 26B and the current in transistor 38 reduced accordingly to conserve circuit area and to reduce current consumption.

Transistor 42 is small geometry device and is biased in a manner similar to transistor 26A and thus will operate in the triode region as does transistor 26A. Voltage V3 can be made equal to the voltage V2 by both making the gate voltages of transistors 40 and 28A equal and making drain-source voltages of transistors 42 and 26A the same. Since both transistors 40 and 28A operate in the saturation region, the gate-source voltages can be made equal in accordance with the following equation:

$$W_{40}/W_{28A} = (I_{C3} + I_{C2})/(I_{C1}/2) \quad (2)$$

where $W_{40}$ and $W_{28A}$ are channel widths of transistors 40 and 28A, respectively, and $(I_{C3} + I_{C2})$ and $I_{C1}/2$ are the drain-source currents of transistors 40 and 28A, respectively.

Thus, for example, equation (2) will be satisfied if $I_{C3}$ and $I_{C2}$ where both equal to one-half of $I_{C1}$ and transistor 40 was twice as wide as transistor 28A.

Continuing, since the drains of transistors 42 and 26A are connected to the gates of transistors 40 and 28A, respectively, the drains of transistors 42 and 26A will be at the same voltage. If the drain-source voltages of transistors 42 and 26A are made to be equal, voltage V2 is equal to V3. Since transistors 42 and 26A both operate in the triode region, the drain-source voltages of the two transistors can be made to be equal if the following conditions are met:

$$W_{42}/W_{26A} = I_{C3}/(I_{C1}/2) \quad (3)$$

where $W_{42}$ and $W_{26A}$ are the channel widths of transistors 42 and 26A, respectively and $I_{C3}$ and $I_{C1}/2$ are the drain-source currents of transistors 42 and 26A, respectively.

Thus, for example, equation (3) would be satisfied if $I_{C3}$ was made equal to one-half of $I_{C1}$ and both transistors were of the same size. Finally, if the source-drain voltages of transistors 42 and 26A are equal, the respective source voltages, V3 and V2, will be equal. Since voltages V1 and V3 are equal and since voltages V2 and V3 are equal, it follows that voltages V1 and V2 are also equal.

The actual value of voltages V1 and V2 is important since it is necessary to maintain transistors 28A and 28B in saturation. A P type transistor 44 is connected in series between the supply voltage $V_{DD}$ and a current source 36 which provides a current $I_{C4}$. The gate and drain of transistor 44 are connected together to maintain the transistor in the saturation region. As can be seen by inspection, voltage V3 is set equal to the supply voltage $V_{DD}$ less the difference in gate-source voltages of transistors 44 and 42. Voltages V1 and V2 are equal to V3, as previously explained, and are thus also equal to supply voltage $V_{DD}$ less the difference in gate-source voltages of transistors 44 and 42. The magnitude of the difference in gate-source voltages can be set by controlling the geometry and current flow through transistor 44 relative to that of transistor 42. The voltage difference magnitude is set so that the drain source voltages of transistors 28A and 28B will be sufficiently large, relative to the difference in gate-source voltage and threshold voltage of the two transistors, to ensure that transistors 28A and 28B operate in the saturation region. Further, as is well known, the difference in gate-source voltages of transistors 42 and 44 will have a temperature coefficient which tracks the temperature coefficient of the minimum drain-source voltage needed to maintain transistors 28A and 28B in saturation. Thus, the drain-source voltages of transistors 28A and 28B can be set close to the minimum value necessary to maintain the transistors in saturation, with that minimum value changing over temperature to compensate for changes in the minimum saturation voltage over temperature. This feature allows the current mirror circuit to reliably operate at reduced levels of supply voltage $V_{DD}$.

Figure 1:
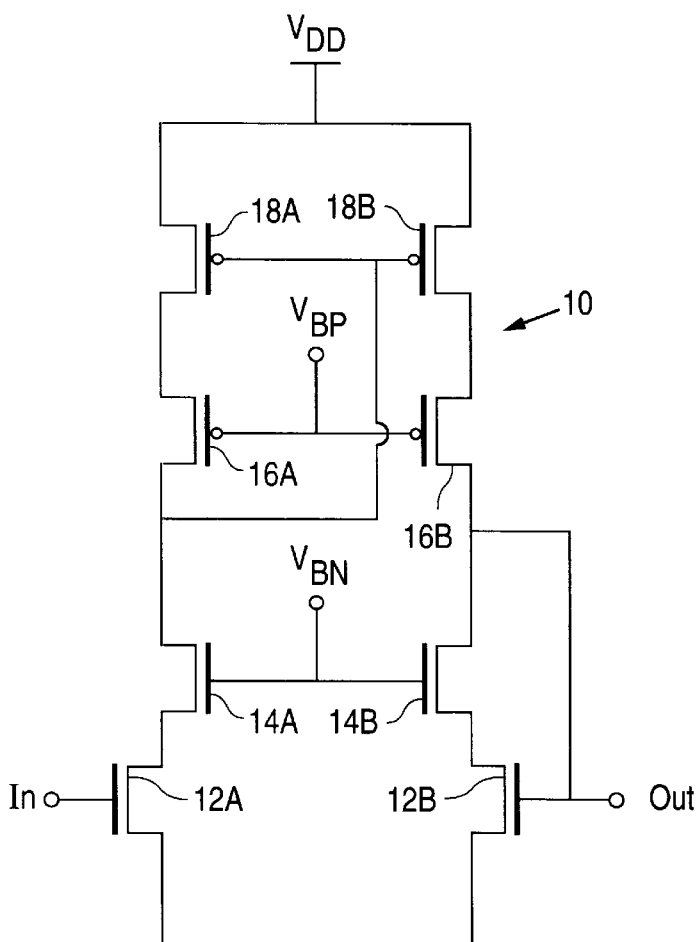
FIG. 1 is a schematic diagram of a prior art buffer circuit.
Figure 3:
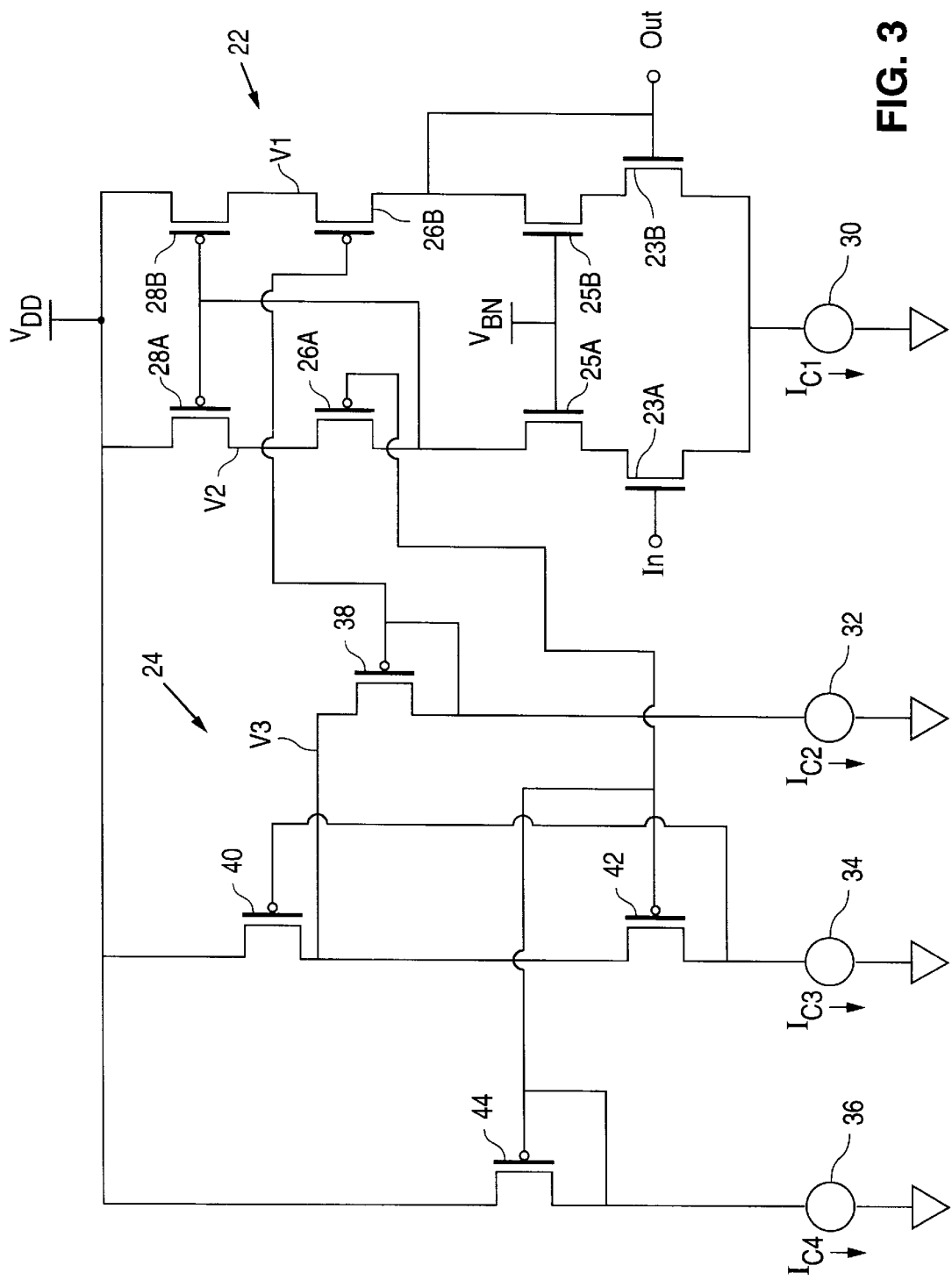
FIG. 3 is a schematic diagram of a buffer circuit incorporating a current mirror load in accordance with the present invention.

The use of a current mirror circuit in accordance with the present invention as an active load in amplifier 22 will significantly improve the amplifier transient response. By way of example, testing has shown that the amount of time required for the FIG. 3 buffer circuit to settle to 0.2 millivolts of a steady state value after a 2 volt step input is approximately one-half the time required by the prior art circuit of FIG. 1.

Thus, a novel high speed current mirror circuit has been disclosed for use as an active load for an amplifier and other related applications. Although one embodiment has been described in some detail, it is to be understood that changes can be made by those skilled in the art without departing from the spirit and scope of the invention as defined by the appended claims. By way of example, it would be possible to implement the current mirror circuit using N type transistors rather than P type, although the slower P type transistor configuration benefits most in terms of improvements in the transient response.

What is claimed is:

1. A current mirror circuit comprising:

first and second MOS transistors of a first conductivity type, with the first transistor defining a drain-source current path connected in series with a drain-source current path defined by the second transistor so as to form a first current path;

third and fourth MOS transistors of the first conductivity type, with the third transistor defining a drain-source current path connected in series with a drain-source current path defined by the fourth transistor so as to form a second current path, with sources of the first and third transistors being connected together, the gates of the first and third transistors being connected together, a drain of the second transistor forming a current mirror input and a drain of the fourth transistor forming a current mirror output; and bias circuitry which includes a first bias voltage output connected to a gate of the second transistor and a second bias voltage output connected to a gate of the fourth transistor, with the bias circuitry being configured so that the second transistor operates in a triode region and the fourth transistor operates in a saturation region.

2. The circuit of claim 1 wherein the second transistor has a channel width which is smaller than a channel width of the fourth transistor.

3. The circuit of claim 2 wherein the channel width of the fourth transistor is at least one and one-half times as large as the channel width of the second transistor.

4. The circuit of claim 1 wherein the bias circuitry is configured to maintain approximately equal drains voltages of the first and third transistors.

5. The circuit of claim 4 wherein the bias circuitry includes a fifth MOS transistor of the first conductivity type operating at a ratio of drain-source current to channel aspect ratio approximately equal to a ratio of drain-source current to channel aspect ratio of the first transistor and wherein a drain voltage of the fifth transistor is approximately equal to a drain voltage of the first transistor.

6. The circuit of claim 5 wherein the bias circuitry includes a sixth MOS transistor of the first conductivity type defining a drain-source path which is connected in series with a drain source path defined by the fifth transistor and which operates at a ratio of drain-source current to channel aspect ratio approximately equal to a ratio of drain-source current to channel aspect ratio of the second transistor and wherein a gate voltage of the sixth transistor is approximately equal to a gate voltage of the second transistor.

7. The circuit of claim 6 wherein the bias circuitry includes a seventh MOS transistor of the first conductivity type defining a drain-source path connected in series with the drain-source path of the fifth transistor, with the fifth transistor operating at a ratio of drain-source current to channel aspect ratio approximately equal to the ratio of drain-source current to channel aspect ratio of the fourth transistor and wherein a gate voltage of the seventh transistor is equal to the gate voltage of the fourth transistor.

8. The circuit of claim 7 wherein the gate of the sixth transistor comprises the first bias voltage output and the gate of the seventh transistor comprises the second bias voltage output.

9. The circuit of claim 8 wherein the bias circuitry further includes an eighth MOS transistor of the first conductivity type connected relative to the sixth transistor such that a drain-source voltage of the first and third transistors is approximately equal to a difference in a magnitude of a gate-source voltage of the eighth and sixth transistors.

10. The circuit of claim 9 wherein the gate of the eighth transistor is connected to the gate of the sixth transistor.

11. A current mirror circuit comprising:

first and second MOS transistors of a first conductivity type, with the first transistor defining a drain-source current path connected in series with a drain-source current path defined by the second transistor so as to form a first current path;

third and fourth MOS transistors of the first conductivity type, with the third transistor defining a drain-source current path connected in series with a drain-source current path defined by the fourth transistor so as to form a second current path, with the fourth transistor having a channel aspect ratio that is at least one and one-half of a channel aspect ratio of the second transistor, with the second and fourth transistors operating at different ratios of current to channel aspect ratios and with sources of the first and third transistors being connected together, the gates of the first and third transistors being connected together, a drain of the second transistor forming a current mirror input and a drain of the fourth transistor forming a current mirror output; and bias circuitry configured to maintain a drain-source voltage of the first transistor equal to a drain source voltage of the third transistor.

12. The circuit of claim 11 wherein the first and third transistors are configured to operate at approximately equal ratios of current to channel aspect ratios.

13. The circuit of claim 12 wherein the bias circuitry causes the first, third and fourth transistors to operate in a saturation region and the second transistor to operate in a triode region.

14. The circuit of claim 11 further including first and second transistors of a second conductivity type, opposite the first conductivity type and connected as a differential pair, with the first transistor of the second conductivity type defining a drain-source path connected in series with the first current path and with the second transistor of the second conductivity type defining a drain-source path connected in series with the second current path, with the circuit and the differential pair forming an amplifier having a first amplifier input at a gate of the first transistor of the second conductivity type and having a second amplifier input at a gate of the second transistor of the second conductivity type and an amplifier output at a node intermediate the fourth transistor of the first conductivity type and the second transistor of the second conductivity type.

15. The circuit of claim 14 wherein the amplifier output is connected to the second amplifier input.

16. A current mirror circuit comprising:

first and second MOS transistors of a first conductivity type, with the first transistor defining a drain-source current path connected in series with a drain-source current path defined by the second transistor so as to form a first current path;

third and fourth MOS transistors of the first conductivity type, with the third transistor defining a drain-source current path connected in series with a drain-source current path defined by the fourth transistor so as to form a second current path, with sources of the first and third transistors being connected together, the gates of the first and third transistors being connected together, a drain of the second transistor forming a current mirror input and a drain of the fourth transistor forming a current mirror output; and bias circuitry configured to bias the first, third and fourth transistors in a saturation region and the second transistor in a triode region.

17. The circuit of claim 16 wherein the first and third transistors have approximately equal channel aspect ratios and wherein the fourth transistor has a channel aspect ratio which is at least one and one-half times larger than a channel aspect ratio of the second transistor.

18. The circuit of claim 17 further including first and second transistors of a second conductivity type, opposite the first conductivity type, and connected as a differential pair, with the first transistor of the second conductivity type defining a drain-source path connected in series with the first current path and with the second transistor of the second conductivity type defining a drain-source path connected in series with the second current path, with the circuit and the differential pair forming an amplifier having a first amplifier input at a gate of the first transistor of the second conductivity type and having a second amplifier input at a gate of the second transistor of the second conductivity type and an amplifier output at a node intermediate the fourth transistor of the first conductivity type and the second transistor of the second conductivity type.

19. A current mirror circuit comprising:

first and second MOS transistors of a first conductivity type, with the first transistor defining a drain-source current path connected in series with a drain-source current path defined by the second transistor so as to form a first current path; and third and fourth MOS transistors of the first conductivity type, with the third transistor defining a drain-source current path connected in series with a drain-source current path defined by the fourth transistor so as to form a second current path, with the fourth transistor having a channel aspect ratio which is at least one and one-half times as large as a channel aspect ratio of the second transistor, with the second and fourth transistors operating at different ratios of current to channel aspect ratios and with sources of the first and third transistors being connected together, the gates of the first and third transistors being connected together, a drain of the second transistor forming a current mirror input and a drain of the fourth transistor forming a current mirror output.

20. The circuit of claim 19 further comprising a bias circuit which includes a fifth transistor of the first conductivity type which operates at a ratio of drain-source current to channel aspect ratio which is approximately equal to a ratio of drain-source current to channel aspect ratio of the fourth transistor and a sixth transistor of the first conductivity type which operates at a ratio of drain-source current to channel aspect ratio which is approximately equal to a ratio of drain-source current to channel aspect ratio of the second transistor.

21. The circuit of claim 20 wherein the fifth transistor operates in a saturation region and the sixth transistor operates in a triode region.

22. The circuit of claim 21 further including first and second transistors of a second conductivity type, opposite the first conductivity type, and connected as a differential pair, with the first transistor of the second conductivity type defining a drain-source path connected in series with the first current path and with the second transistor of the second conductivity type defining a drain-source path connected in series with the second current path, with the circuit and the differential pair forming an amplifier having a first amplifier input at a gate of the first transistor of the second conductivity type and having a second amplifier input at a gate of the second transistor of the second conductivity type and an amplifier output at a node intermediate the fourth transistor of the first conductivity type and the second transistor of the second conductivity type.

23. The circuit of claim 22 wherein the first and second conductivity types are P type and N type, respectively.

24. A method of controlling a current mirror circuit which includes first and second MOS transistors of a first conductivity type, with the first transistor defining a drain-source current path connected in series with a drain-source current path defined by the second transistor so as to form a first current path and third and fourth MOS transistors of the first conductivity type, with the third transistor defining a drain-source current path connected in series with a drain-source current path defined by the fourth transistor so as to form a second current path, with sources of the first and third transistors being connected together and with the gates of the first and third transistors being connected together, said method comprising:

biasing the first, third and fourth transistors in a saturation region;

biasing the second transistor in a triode region;

applying an input current to a drain of the second transistor; and receiving an output current at a drain of the fourth transistor, with the output current being proportional to the input current.

25. The method of claim 24 wherein the first and third transistors have respective channel aspect ratios which are approximately equal and wherein the input and output currents are approximately equal.

26. The method of claim 25 further including connecting a drain-source path of a first MOS transistor of a second conductivity type, opposite the first conductivity type, in series with the first current path and connecting a drain-source path of a second MOS transistor of the second conductivity type in series with the second current path and wherein the applying includes varying a gate-source voltage of the first transistor of the second conductivity type so that the output current will vary.

27. A method of controlling a current mirror circuit which includes first and second MOS transistors of a first conductivity type, with the first transistor defining a drain-source current path connected in series with a drain-source current path defined by the second transistor so as to form a first current path and third and fourth MOS transistors of the first conductivity type, with the third transistor defining a drain-source current path connected in series with a drain-source current path defined by the fourth transistor so as to form a second current path, with sources of the first and third transistors being connected together, the gates of the first and third transistors being connected together and with the fourth transistor having a channel aspect ratio which is at least one and one-half times as large as a channel aspect ratio of the second transistor, said method comprising:

biasing the first, third and fourth transistors in a saturation region;

maintaining drains of the first and third transistors at approximately equal voltages;

applying an input current to a drain of the second transistor;

operating the first and third transistors at a first ratio of current to channel aspect ratio and the second and fourth transistors at a second ratio of current to channel aspect ratio, with the first and second ratios being different; and receiving an output current at a drain of the fourth transistor, with the output current being proportional to the input current.

28. The method of claim 27 wherein the first and third transistors have respective channel aspect ratios which are approximately equal and wherein the input and output currents are approximately equal.

29. The method of claim 28 further including biasing the second transistor in a triode region.

* * * * *